United States Patent [19]
Laskaris et al.

[11] Patent Number: 5,568,104
[45] Date of Patent: Oct. 22, 1996

[54] OPEN MRI SUPERCONDUCTIVE MAGNET WITH CRYOGENIC-FLUID COOLING

[75] Inventors: Evangelos T. Laskaris, Schenectady; Bizhan Dorri, Clifton Park, both of N.Y.

[73] Assignee: General Electric Company, Schenectady, N.Y.

[21] Appl. No.: 553,738

[22] Filed: Oct. 23, 1995

[51] Int. Cl.[6] ............................. F25B 19/00; G01V 3/00
[52] U.S. Cl. ........................ 335/216; 62/51.1; 324/318
[58] Field of Search ................. 335/216; 324/318–320; 505/892, 893; 62/51.1

[56] References Cited

U.S. PATENT DOCUMENTS

| | | | |
|---|---|---|---|
| 5,291,169 | 3/1994 | Ige et al. | 335/216 |
| 5,410,287 | 4/1995 | Laskaris et al. | 335/216 |
| 5,414,360 | 5/1995 | Westphal et al. | 324/318 |
| 5,448,214 | 9/1995 | Laskaris | 335/301 |
| 5,485,088 | 1/1996 | Westphal et al. | 324/320 |

OTHER PUBLICATIONS

Pending U.S. Patent Application Serial No. 08/418,229, filed Apr. 6, 1995, by K. G. Herd et al., entitled "Cryogenic Cooling System", US Patent 5,513,498.

Pending U.S. patent application Ser. No. 08/228,178, filed Aug. 10, 1994, by K. G. Herd, entitled "Remote Cooling System for a Superconducting Magnet".

Concurrently filed U.S. Patent Application RD-24637, by Bizhan Dorri et al, entitled "Cryogenic-Fluid-Cooled Open MRI Magnet with Uniform Magnetic Field", Ser. No. 08/547085, filed Oct. 23, 1995.

Primary Examiner—Brian W. Brown
Assistant Examiner—Raymond M. Barrera
Attorney, Agent, or Firm—Douglas E. Erikson; Marvin Snyder

[57] ABSTRACT

An open magnetic resonance imaging (MRI) magnet having first and second spaced-apart superconductive coil assemblies each including a toroidal-shaped coil housing containing a superconductive main coil in thermal contact with a cryogenic fluid contained in a dewar. Preferably, each main coil is located outside of and in solid-conduction thermal contact with its corresponding dewar (instead of inside the dewar). Preferably, a surrounding single (not double) thermal shield is cooled by liquid cryogen boil-off or by a cryocooler coldhead. All this allows the main coil to be located closer to the magnet's open space which reduces magnet cost by reducing the amount of coil needed for the same-strength magnetic field.

3 Claims, 4 Drawing Sheets

5,568,104

OPEN MRI SUPERCONDUCTIVE MAGNET WITH CRYOGENIC-FLUID COOLING

BACKGROUND OF THE INVENTION

The present invention relates generally to a superconductive magnetic resonance imaging (MRI) magnet, and more particularly to such a magnet having an open design.

MRI systems employing superconductive or other type magnets are used in various fields such as medical diagnostics. Known superconductive magnet designs include closed magnets and open magnets. Closed magnets typically have a single, tubular-shaped superconductive coil assembly having a bore and are cooled by liquid helium or a cryocooler. With cryocooler cooling of a closed magnet, the superconductive coil assembly includes a superconductive main coil which is surrounded by a single thermal shield which is surrounded by a vacuum enclosure, and the closed magnet also includes a cryocooler coldhead having a housing attached to the vacuum enclosure, a first stage in solid-conduction thermal contact with the single thermal shield, and a second stage in solid-conduction thermal contact with the superconductive main coil. With liquid-helium cooling of a closed magnet, the superconductive coil assembly includes a superconductive main coil which is at least partially immersed in liquid helium contained in a helium dewar which is surrounded by a dual thermal shield which is surrounded by a vacuum enclosure. It is known to reduce helium boil-off in closed magnets by adding a cryocooler whose first stage is in solid-conduction thermal contact with the outer one of the two spaced-apart thermal shields of the dual thermal shield and whose second stage is in solid-conduction thermal contact with the inner one of the two spaced-apart thermal shields of the dual thermal shield.

Known open magnets are solid-conduction cryocooler-cooled and typically employ two spaced-apart superconductive coil assemblies with the open space between the assemblies allowing for access by medical personnel for surgery or other medical procedures during MRI imaging. The patient may be positioned in that open space or also in the bore of the toroidal-shaped coil assemblies. The open space helps the patient overcome any feelings of claustrophobia that may be experienced in a closed magnet design. A cryocooler coldhead attached to one superconductive coil assembly can cool the second superconductive coil assembly by conduction cooling through the structural posts which attach together the spaced-apart superconductive coil assemblies. Cryocooler-cooled open magnets are known which also add a bucking coil carrying an electric current in an opposite direction to that of the superconductive main coil and located radially inward of the superconductive main coil to improve the quality of the MRI imaging. The literature is silent on helium-cooled open magnets, presumably because the superconductive main coil structurally cannot be located longitudinally close enough to the open space to allow only a cost-effective amount of superconductor main coil to be used for MRI imaging. What is needed is a helium-cooled open MRI superconductive magnet

SUMMARY OF THE INVENTION

It is an object of the invention to provide a cryogenic-fluid-cooled open superconductive MRI magnet.

The open MRI magnet of the invention includes a first superconductive coil assembly including a generally toroidal-shaped first coil housing, a first cryogenic fluid, and a generally annular-shaped first superconductive main coil. The first cryogenic fluid is located within the first coil housing. The first coil housing surrounds a first bore and has a generally longitudinal first axis. The first main coil is generally coaxially aligned with the first axis, positioned within the first coil housing, and located in thermal contact with the first cryogenic fluid. The open MRI magnet also includes a second superconductive coil assembly including a generally toroidal-shaped second coil housing, a second cryogenic fluid, and a generally annular-shaped second superconductive main coil. The second cryogenic fluid is located within the second coil housing. The second coil housing is longitudinally spaced apart from the first coil housing, surrounds a second bore, and has a generally longitudinal second axis which is generally coaxially aligned with the first axis. The second main coil is generally coaxially aligned with the second axis, positioned within the second coil housing, and located in thermal contact with the second cryogenic fluid. The open MRI magnet further includes structural posts each having a first end attached to the first coil housing and a second end attached to the second coil housing.

In one preferred embodiment, a dewar is positioned within each coil housing to contain the cryogenic fluid, and the superconductive main coil is located outside of and in solid-conduction thermal contact with the dewar. In a second preferred embodiment, each coil assembly includes a single thermal shield with cryogen boil-off reduced by the shield being in solid-conduction thermal contact with either a cold stage of a cryocooler coldhead or a heat exchanger tube which is in fluid communication with the cryogen boil-off.

Several benefits and advantages are derived from the invention. Applicant's open magnet design overcomes any claustrophobic feelings of patients and gives access to the patient by medical personnel for surgery or other medical procedures during MRI imaging. Applicant's cryogenic-fluid-cooled design is less expensive than known cryocooler-cooled designs. Applicants' "coil-outside-the-dewar" and "single-thermal-shield" designs allow the superconductive main coils structurally to be located longitudinally close to the magnet's open space which reduces the cost of the magnet by reducing the amount of superconductor main coil needed for the same-strength magnetic field.

BRIEF DESCRIPTION OF THE DRAWINGS

The accompanying drawings illustrate several preferred embodiments of the present invention wherein.

DETAILED DESCRIPTION OF THE INVENTION

Figure 1:
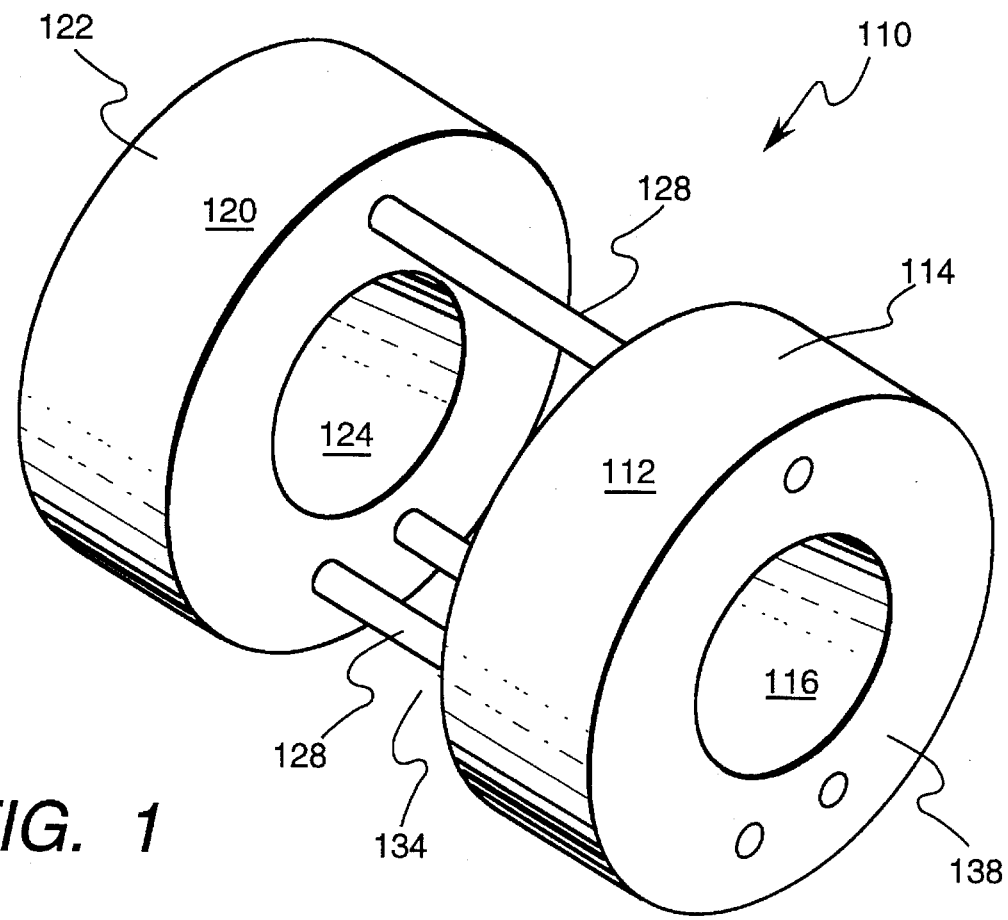
FIG. 1 is a perspective view of a first preferred embodiment of the open MRI magnet of the invention.
Figure 3:
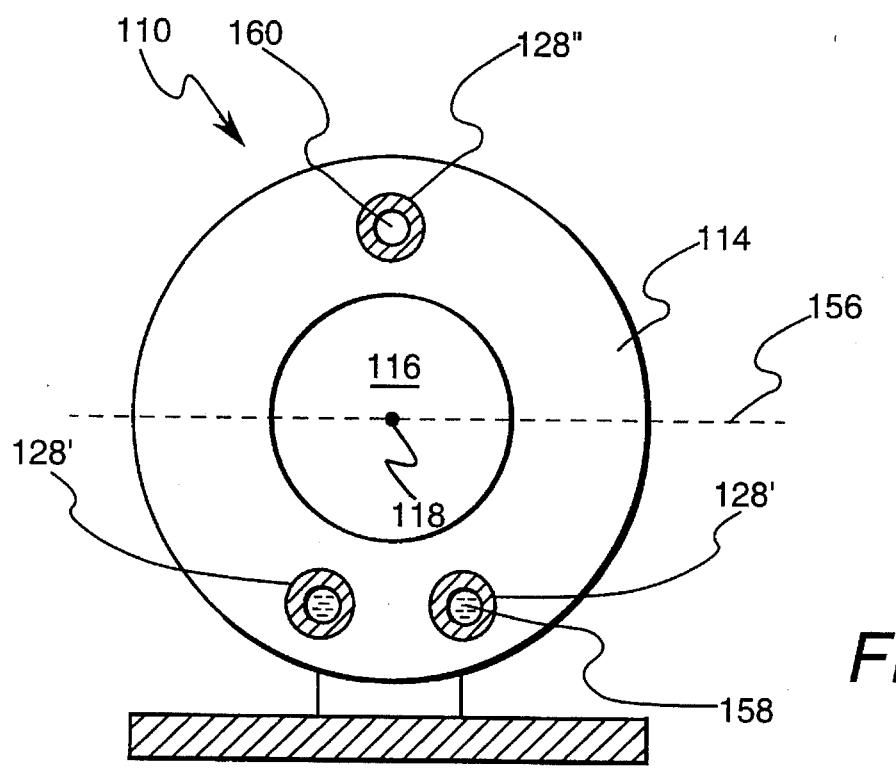
FIG. 3 is a schematic cross-sectional view of the MRI magnet of FIGS. 1 and 2 taken along the lines 3—3 of FIG. 2.
Figure 2:
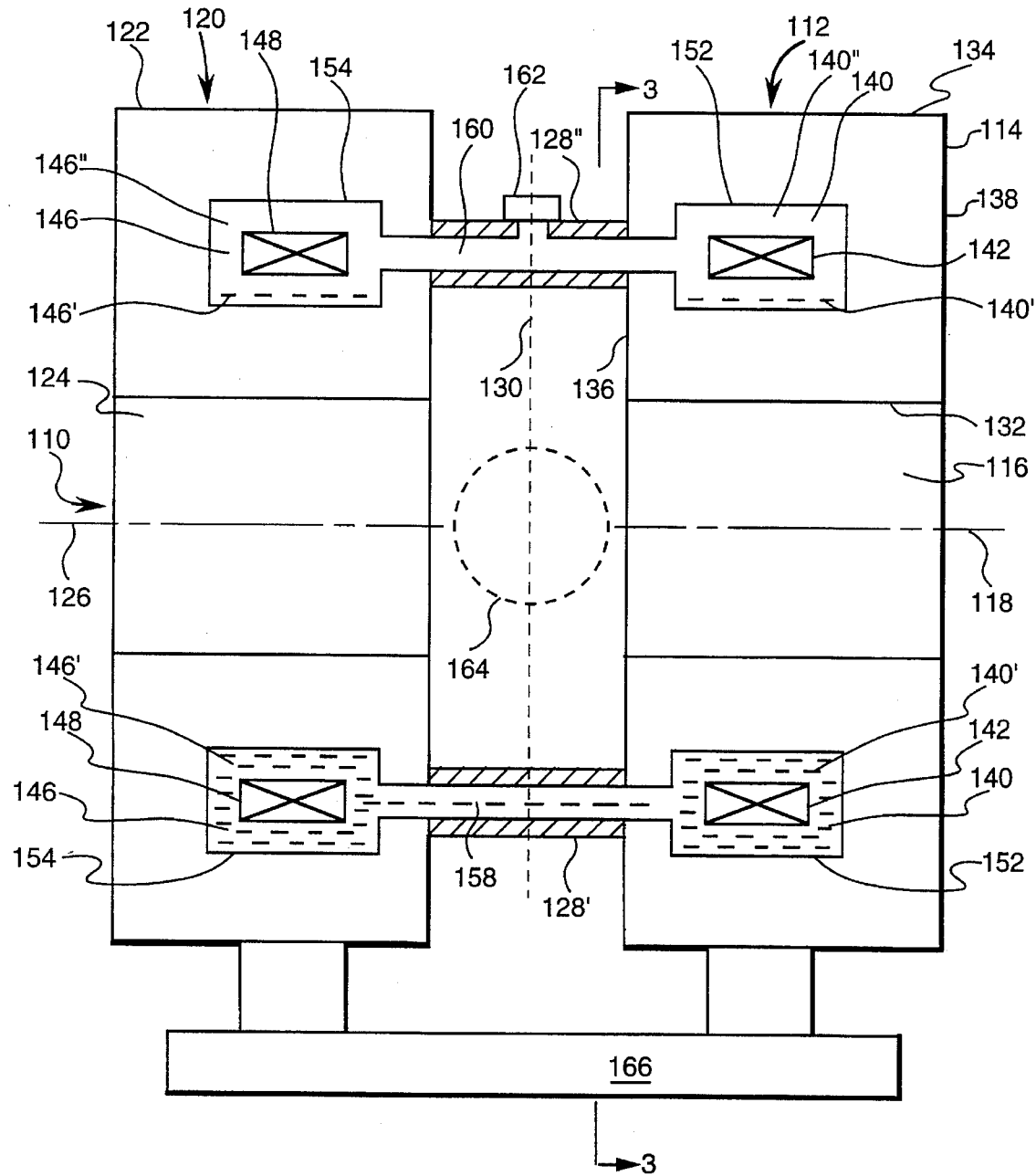
FIG. 2 is a schematic cross-sectional side-elevational view of the MRI magnet of FIG. 1 with a magnet floor mount added.

Referring now to the drawings, wherein like numerals represent like elements throughout, FIGS. 1–3 show a first preferred embodiment of the open magnetic resonance imaging (MRI) magnet 110 of the present invention. The magnet 110 includes a first superconductive coil assembly 112 with a generally toroidal-shaped first coil housing 114 which surrounds a first bore 116 and which has a generally longitudinal first axis 118. The magnet 110 also includes a second superconductive coil assembly 120 with a generally toroidal-shaped second coil housing 122 which surrounds a second bore 124 and which has a generally longitudinal second axis 126. The second coil housing 122 is longitudinally spaced apart from the first coil housing 114, and the second axis 126 is generally coaxially aligned with the first axis 118. The magnet 110 further includes a plurality of structural posts 128 each having a first end attached to the first coil housing 114 and each having a second end attached to the second coil housing 122. Preferably, the second superconductive coil assembly 120 is a generally mirror image of the first superconductive coil assembly 112 about a plane 130 (seen on edge as a dashed line in FIG. 2) oriented perpendicular to the first axis 118 and disposed longitudinally midway between the first and second coil housings 114 and 122.

The first coil housing 114 includes a first generally-circumferential outside surface 132 facing generally towards the first axis 118 and a second generally-circumferential outside surface 134 radially spaced apart from the first circumferential outside surface 132 and facing generally away from the first axis 118. The first coil housing 114 also includes a first generally-annular outside surface 136 facing generally towards the plane 130 and a second generally-annular outside surface 138 longitudinally spaced apart from the first annular outside surface 136 and facing generally away from the plane 130.

The first superconductive coil assembly 112 additionally includes a first cryogenic fluid 140 disposed within the first coil housing 114. The first superconductive coil assembly 112 also includes a generally annular-shaped first superconductive main coil 142 and preferably includes generally annular-shaped additional superconductive main coils (not shown in the figures). The additional superconductive main coils may be needed to achieve a high magnetic field strength, within the magnet's imaging volume, without exceeding the critical current density of the superconductor being used in the coils, as is known to those skilled in the art. The first superconductive main coil 142 is conventionally supported on a coil form (not shown in the figures). The first superconductive main coil 142 is generally coaxially aligned with the first axis 118, is disposed within the first coil housing 114, is disposed in thermal contact with the first cryogenic fluid 140, and carries a first main electric current in a first direction. The first direction is defined to be either a clockwise or a counterclockwise circumferential direction about the first axis 118 with any slight longitudinal component of current direction being ignored. The first superconductive main coil 142 typically would be a superconductive wire or superconductive tape wound such that the first superconductive main coil 142 has a longitudinal extension and a radial extension (i.e., radial thickness) far greater than the corresponding dimensions of the superconductive wire or superconductive tape.

As previously mentioned and as shown in FIGS. 1 and 2, the second superconductive coil assembly 120 is a generally mirror image of the first superconductive coil assembly 112 about the plane 130. Therefore, in addition to the second coil housing 122, the second superconductive coil assembly 120 additionally includes a second cryogenic fluid 146 disposed within the second coil housing 122, also includes a generally annular-shaped second superconductive main coil 148, and preferably includes generally annular-shaped additional superconductive main coils (not shown in the figures). It is noted that the additional superconductive main coils would be needed by the second superconductive coil assembly 120 to balance any extra additional superconductive main coils of the first superconductive coil assembly 112, as can be appreciated by those skilled in the art. The second superconductive main coil 148 is conventionally supported on a coil form (not shown in the figures). The second superconductive main coil 148 is generally coaxially aligned with the second axis 126, is disposed within the second coil housing 122, is disposed in thermal contact with the second cryogenic fluid 146, and carries a second main electric current in the first direction (i.e., in the same direction as the electric current in the first superconductive main coil 142).

The first superconductive coil assembly 112 has a first dewar 152 disposed within and generally spaced-apart from the first coil housing 114 and containing the first cryogenic fluid 140, and the second superconductive coil assembly 120 has a second dewar 154 disposed within and generally spaced-apart from the second coil housing 122 and containing the second cryogenic fluid 146. In the first preferred embodiment, as seen in FIG. 2, the first dewar 152 is spaced-apart from and surrounds the first superconductive main coil 142, and the first superconductive main coil 142 is at least partially (and preferably completely) immersed in the first cryogenic fluid 140. Likewise, the second dewar 154 is spaced-apart from and surrounds the second superconductive main coil 148, and the second superconductive main coil 148 is at least partially (and preferably completely) immersed in the second cryogenic fluid 146. As seen from FIGS. 1–3, preferably the structural posts 128 include a lower structural post 128' and an upper structural post 128". The lower structural post 128' is disposed below a horizontal plane 156 (seen on edge as a dashed line in FIG. 3) containing the first axis 118 (seen as a dashed line in FIG. 2 and seen head-on as a dot in FIG. 3), and the lower structural post 128' has a conduit 158. The upper structural post 128" is disposed above the horizontal plane 156, and the upper structural post 128" has a conduit 160. It is noted from FIG. 2 that the second cryogenic fluid 146 is in fluid communication with the first cryogenic fluid 140 through the conduits 158 and 160 of the lower and upper structural posts 128' and 128". In other words, the conduits 158 and 160 fluidly interconnect the first and second dewars 152 and 154. Preferably, the magnet 110 has two lower structural posts 128' and one upper structural post 128".

In an exemplary embodiment, the first cryogenic fluid 140 includes liquid cryogenic fluid 140' and gaseous cryogenic fluid 140", and the second cryogenic fluid 146 includes liquid cryogenic fluid 146' and gaseous cryogenic fluid 146". The conduit 158 of the lower structural post 128' contains essentially only liquid cryogenic fluid, and the conduit 160 of the upper structural post 128" contains essentially only gaseous cryogenic fluid. In a favored enablement, the liquid first and second cryogenic fluids 140' and 146' each consist of liquid helium, and the gaseous first and second cryogenic fluids 140" and 146" each consist of gaseous helium which has boiled-off from the liquid helium. Preferably, the upper structural post 128" includes a cryogenic-fluid boil-off stack 162 longitudinally disposed generally midway between the first and second coil housings 114 and 122.

Typically, the two coil housings 114 and 122 and the conduit-containing structural posts 128' and 128" together form a vacuum enclosure. A single thermal shield (omitted from the figures for clarity) is spaced-apart from and surrounds each dewar 152 and 154 and is spaced-apart from and surrounds the conduits 158 and 160 with the single thermal shield itself being spaced apart from and surrounded by the coil housings 114 and 122 and the walls of the conduit-containing structural posts 128' and 128". Conventional thermally-insulative spacers (not shown) separate spaced-apart elements, as is known to the artisan. The superconductive main coils 142 and 148 of the magnet 110 typically produce a generally spherical imaging volume 164 (shown as a dotted circle in FIG. 2) centered generally at the intersection of the plane 130 and the first axis 118. It is noted that the magnet 110 is supported on a conventional magnet floor mount 166.

Figure 4:
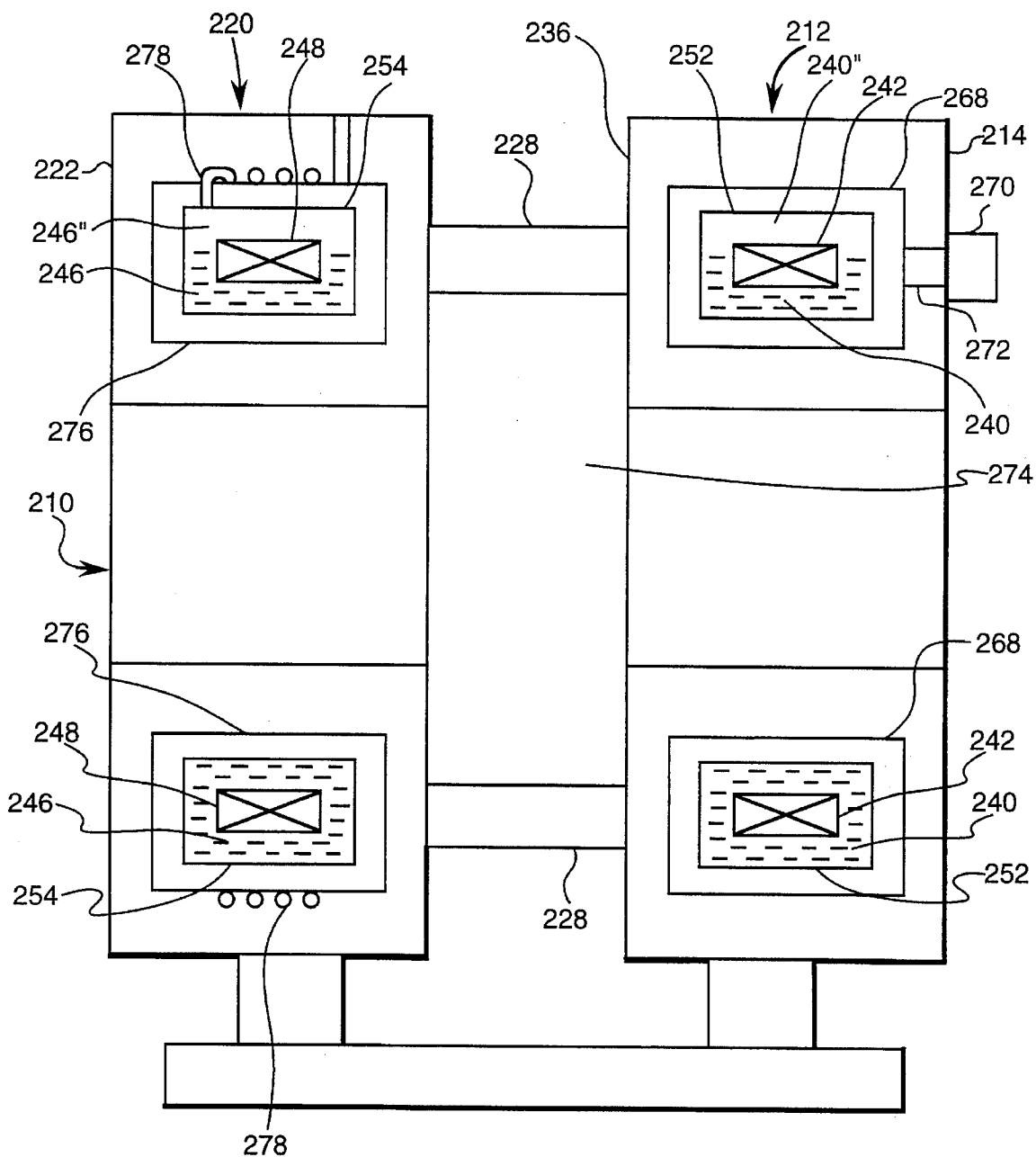
FIG. 4 is a view, as in FIG. 2, but of a second preferred embodiment of the open MRI magnet of the invention.

Referring again to the drawings, FIG. 4 shows a second preferred embodiment of the open magnetic resonance imaging (MRI) magnet 210 of the present invention. Magnet 210 is identical to magnet 110 of the first preferred embodiment of the invention, with differences as hereinafter noted. The second cryogenic fluid 246 is fluidly independent of the first cryogenic fluid 240 (i.e., in the second preferred embodiment there are no conduits in the structural posts 228 to fluidly interconnect the two dewars 252 and 254).

Also, in the second preferred embodiment, the first superconductive coil assembly 212 includes a thermal shield 268 disposed within and generally spaced-apart from the first coil housing 214 and generally surrounding and generally spaced apart from the first superconductive main coil 242. The thermal shield 268 is the only thermal shield disposed within the first coil housing 214. The magnet 210 also includes a high-efficiency cryocooler coldhead 270 having a cold stage 272 in solid-conduction thermal contact with the thermal shield 268. This helps reduce liquid cryogen boil-off and allows for a single thermal shield design (instead of a conventional dual thermal shield design) which allows the first superconductive main coil 242 structurally to be located longitudinally close to the magnet's open space 274 (or, equivalently, close to the first annular outside surface 236 of the first coil housing 214) which reduces the cost of the magnet 210 by reducing the amount of superconductor main coil needed for the same-strength magnetic field. The second superconductive coil assembly 220 likewise may have a thermal shield cooled by solid conduction by the cryocooler coldhead 270 through one or more of the structural posts 228 or cooled by its own cryocooler coldhead (not shown in the figures).

As shown in FIG. 4, the second superconductive coil assembly 220 includes a thermal shield 276 disposed within and generally spaced-apart from the second coil housing 222 and generally surrounding and generally spaced apart from the second superconductive main coil 248. The thermal shield 276 is the only thermal Shield disposed within the second coil housing 222. The magnet 210 also includes a heat exchanger tube 278 in fluid communication with the gaseous cryogenic fluid 246" of the second cryogenic fluid 246 and wrapped around and in solid-conduction thermal contact with the thermal shield 276. This helps reduce liquid cryogen boil-off and allows for a single thermal shield design (instead of a conventional dual thermal shield design) which allows the second superconductive main coil 248 structurally to be located longitudinally close to the magnet's open space 274 which reduces the cost of the magnet 210 by reducing the amount of superconductor main coil needed for the same-strength magnetic field. The first superconductive coil assembly 212 likewise may have a thermal shield cooled by a heat exchanger tube in fluid communication with the gaseous cryogenic fluid 240" of the first cryogenic fluid 240 (not shown in the figures).

Figure 5:
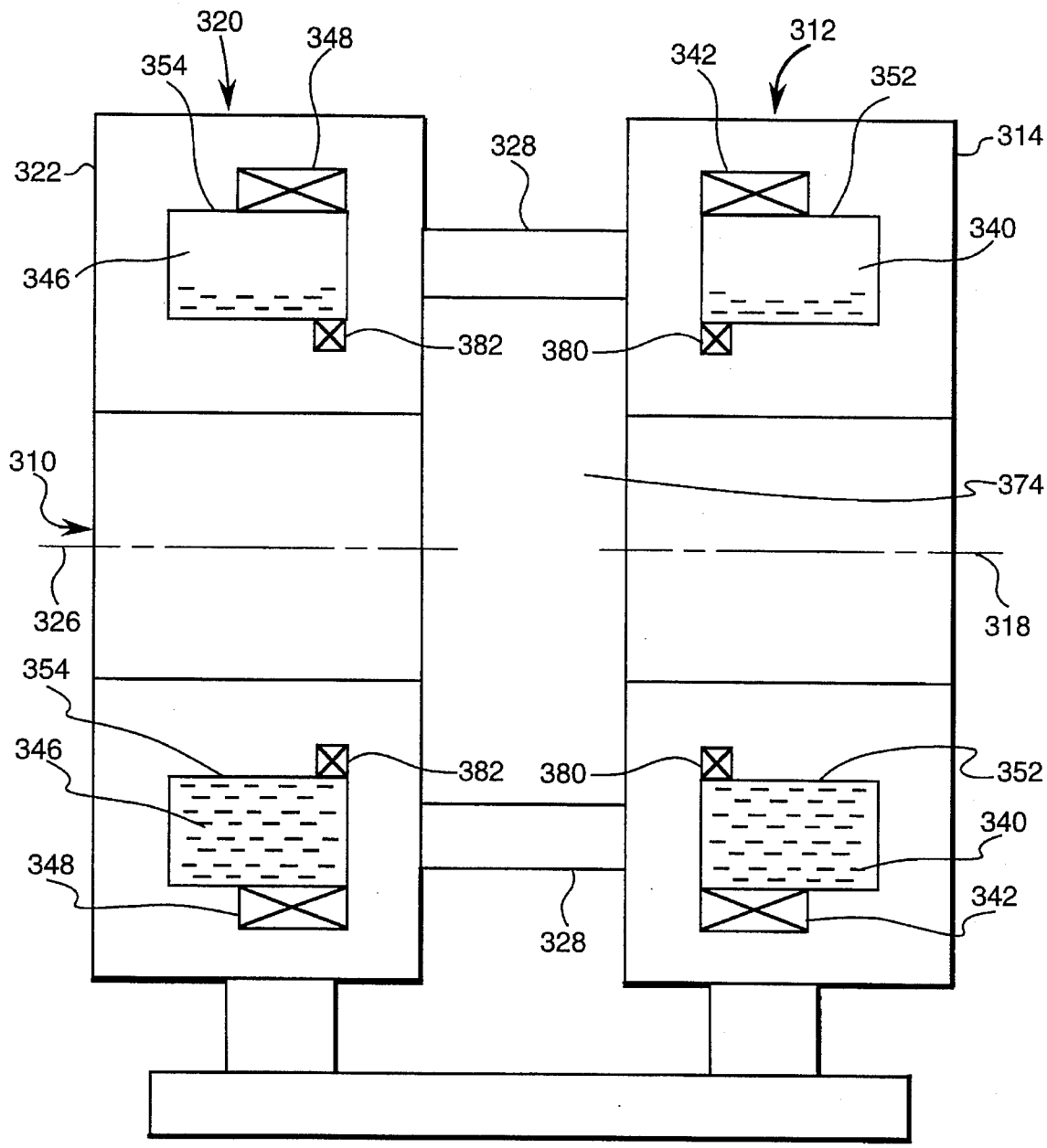
FIG. 5 is a view, as in FIG. 2, but of a third preferred embodiment of the open MRI magnet of the invention.

Referring again to the drawings, FIG. 5 shows a third preferred embodiment of the open magnetic resonance imaging (MRI) magnet 310 of the present invention. Magnet 310 is identical to magnet 110 of the first preferred embodiment of the invention, with differences as hereinafter noted. The second cryogenic fluid 346 is fluidly independent of the first cryogenic fluid 340 (i.e., in the third preferred embodiment there are no conduits in the structural posts 328 to fluidly interconnect the two dewars 352 and 354).

Here, the first superconductive coil assembly 312 further includes a first superconductive bucking coil 380. The first superconductive bucking coil 380 is generally coaxially aligned with the first axis 318, is located within the first coil housing 314, and is disposed radially inward of the first superconductive main coil 342. The first superconductive bucking coil 380 carries an electric current in a direction opposite to the first direction. Also, the second superconductive coil assembly 320 further includes a second superconductive bucking coil 382. The second superconductive bucking coil 382 is generally coaxially aligned with the second axis 326, is located within the second coil housing 322, and is disposed radially inward of the second superconductive main coil 348. The second superconductive bucking coil 382 carries an electric current in a direction opposite to the first direction.

Instead of coils being immersed in cryogenic fluid as in the first preferred embodiment, the third preferred embodiment has the first superconductive main coil 342 disposed outside of and in solid-conduction thermal contact with the first dewar 352 and has the second superconductive main coil 348 disposed outside of and in solid-conduction thermal contact with the second dewar 354. In a similar manner, the first superconductive bucking coil 380 is disposed outside of and in solid-conduction thermal contact with the first dewar 352, and the second superconductive bucking coil 382 is disposed outside of and in solid-conduction thermal contact with the second dewar 354. A single thermal shield (omitted from FIG. 5 for clarity) surrounds the combination of the first dewar 352, first superconductive main coil 342, and first superconductive bucking coil 380. Likewise, a single thermal shield (omitted from FIG. 5 for clarity) surrounds the combination of the second dewar 354, second superconductive main coil 348, and second superconductive bucking coil 382. Positioning the superconductive main coils 342 and 348 (and the superconductive bucking coils 380 and 382) outside the dewars 352 and 354, while still being cooled by the cryogenic fluid 340 and 346 within the dewars 352 and 354 by solid conduction from the walls of the dewars 352 and 354, allows the first and second superconductive main coils 342 and 348 (and the first and second superconductive bucking coils 380 and 382) structurally to be located longitudinally close to the magnet's open space 374 which reduces the cost of the magnet 310 by reducing the amount of superconductor main coil needed for the same-strength magnetic field.

The foregoing description of several preferred embodiments of the invention has been presented for purposes of illustration. It is not intended to be exhaustive or to limit the invention to the precise form disclosed, and obviously many modifications and variations are possible in light of the above teaching. It is intended that the scope of the invention be defined by the claims appended hereto.

We claim:

1. An open magnetic resonance imaging magnet comprising:

a) a first superconductive coil assembly including:
      (1) a generally toroidal-shaped first coil housing surrounding a first bore and having a generally longitudinal first axis;

(2) a first cryogenic fluid disposed within said first coil housing; and (3) a generally annular-shaped first superconductive main coil generally coaxially aligned with said first axis, disposed within said first coil housing, and disposed in thermal contact with said first cryogenic fluid;

b) a second superconductive coil assembly including:

(1) a generally toroidal-shaped second coil housing longitudinally spaced apart from said first coil housing, surrounding a second bore and having a generally longitudinal second axis generally coaxially aligned with said first axis; and (2) a second cryogenic fluid disposed within said second coil housing; and (3) a generally annular-shaped second superconductive main coil generally coaxially aligned with said second axis, disposed within said second coil housing, and disposed in thermal contact with said second cryogenic fluid;

c) a plurality of structural posts each having a first end attached to said first coil housing and having a second end attached to said second coil housing, wherein said second superconductive coil assembly is a generally mirror image of said first superconductive coil assembly about a plane oriented perpendicular to said first axis and disposed longitudinally midway between said first and second coil housings;

d) a first dewar disposed within and generally spaced-apart from said first coil housing and containing said first cryogenic fluid; and e) a second dewar disposed within and generally spaced-apart from said second coil housing and containing said second cryogenic fluid, wherein said first superconductive main coil is disposed outside of and in solid-conduction thermal contact with said first dewar and said second superconductive main coil is disposed outside of and in solid-conduction thermal contact with said second dewar.

2. An open magnetic resonance imaging magnet comprising:

a) a first superconductive coil assembly including:

(1) a generally toroidal-shaped first coil housing surrounding a first bore and having a generally longitudinal first axis;

(2) a first cryogenic fluid disposed within said first coil housing; and (3) a generally annular-shaped first superconductive main coil generally coaxially aligned with said first axis, disposed within said first coil housing, and disposed in thermal contact with said first cryogenic fluid;

b) a second superconductive coil assembly including:

(1) a generally toroidal-shaped second coil housing longitudinally spaced apart from said first coil housing, surrounding a second bore and having a generally longitudinal second axis generally coaxially aligned with said first axis; and (2) a second cryogenic fluid disposed within said second coil housing; and (3) a generally annular-shaped second superconductive main coil generally coaxially aligned with said second axis, disposed within said second coil housing, and disposed in thermal contact with said second cryogenic fluid; and c) a plurality of structural posts each having a first end attached to said first coil housing and having a second end attached to said second coil housing, wherein said second superconductive coil assembly is a generally mirror image of said first superconductive coil assembly about a plane oriented perpendicular to said first axis and disposed longitudinally midway between said first and second coil housings, wherein said first superconductive coil assembly includes a thermal shield disposed within and generally spaced-apart from said first coil housing and generally surrounding and generally spaced apart from said first superconductive main coil, wherein said thermal shield is the only thermal shield disposed within said first coil housing, and also including a cryocooler coldhead having a cold stage in solid-conduction thermal contact with said thermal shield.

3. An open magnetic resonance imaging magnet comprising:

a) a first superconductive coil assembly including:

(1) a generally toroidal-shaped first coil housing surrounding a first bore and having a generally longitudinal first axis;

(2) a first cryogenic fluid disposed within said first coil housing; and (3) a generally annular-shaped first superconductive main coil generally coaxially aligned with said first axis, disposed within said first coil housing, and disposed in thermal contact with said first cryogenic fluid;

b) a second superconductive coil assembly including:

(1) a generally toroidal-shaped second coil housing longitudinally spaced apart from said first coil housing, surrounding a second bore and having a generally longitudinal second axis generally coaxially aligned with said first axis; and (2) second cryogenic fluid disposed within said second coil housing; and (3) in generally annular-shaped second superconductive main coil generally coaxially aligned with said second axis, disposed within said second coil housing, and disposed in thermal contact with said second cryogenic fluid; and c) a plurality of structural posts each having a first end attached to said first coil housing and having a second end attached to said second coil housing, wherein said second superconductive coil assembly is a generally mirror image of said first superconductive coil assembly about a plane oriented perpendicular to said first axis and disposed longitudinally midway between said first and second coil housings, wherein said second cryogenic fluid includes gaseous cryogenic fluid, wherein said second superconductive coil assembly includes a thermal shield disposed within and generally spaced-apart from said second coil housing and generally surrounding and generally spaced apart from said second superconductive main coil, wherein said thermal shield is the only thermal shield disposed within said second coil housing, and also including a heat exchanger tube in fluid communication with said gaseous cryogenic fluid and wrapped around and in solid-conduction thermal contact with said thermal shield.

\* \* \* \* \*